US011464127B2

(12) United States Patent
Gao (10) Patent No.: US 11,464,127 B2
(45) Date of Patent: Oct. 4, 2022

(54) BLIND MATING ADAPTING UNIT

(71) Applicant: BAIDU USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/191,243

(22) Filed: Mar. 3, 2021

(65) Prior Publication Data
US 2022/0287197 A1    Sep. 8, 2022

(51) Int. Cl.
*H05K 7/14* (2006.01)
*H05K 7/20* (2006.01)

(52) U.S. Cl.
CPC ......... *H05K 7/1417* (2013.01); *H05K 7/1487* (2013.01); *H05K 7/1489* (2013.01); *H05K 7/20272* (2013.01)

(58) Field of Classification Search
CPC .. H05K 7/1417; H05K 7/1487; H05K 7/1489; H05K 7/20272; H01L 23/473
USPC .......................................... 361/679.01, 679.45
See application file for complete search history.

(56) References Cited

U.S. PATENT DOCUMENTS

| | | | |
|---|---|---|---|
| 10,164,373 B1 | 12/2018 | Cheon et al. | |
| 2006/0187638 A1* | 8/2006 | Vinson | H05K 7/20009 361/698 |
| 2016/0010772 A1* | 1/2016 | Tiberghien | F16L 21/02 165/177 |
| 2016/0066480 A1* | 3/2016 | Eckberg | F16L 37/30 361/679.53 |
| 2016/0270260 A1* | 9/2016 | Franz | H05K 7/20272 |
| 2017/0127575 A1* | 5/2017 | Lunsman | H05K 7/20772 |
| 2017/0257980 A1 | 9/2017 | Fukunaga | |
| 2018/0242478 A1* | 8/2018 | Cui | H05K 7/20772 |
| 2019/0364681 A1* | 11/2019 | Hangebrauck | E05C 1/02 |
| 2020/0178413 A1* | 6/2020 | Thibaut | H05K 7/20818 |

FOREIGN PATENT DOCUMENTS

CN    112020264 A    12/2020

* cited by examiner

*Primary Examiner* — Adrian S Wilson
*Assistant Examiner* — Gage Crum
(74) *Attorney, Agent, or Firm* — Womble Bond Dickinson (US) LLP (57) ABSTRACT

A blind mating adapter unit is disclosed that is adjustably locatable on a server chassis. The blind mating adapter unit is rotatably adjustable to align the orientation of one or more fluid connectors on the blind mating adapter unit to a corresponding one or more mating fluid connectors on a coolant distribution manifold installed in a server rack. Alternatively, the blind mating adapter can be separable into two halves that can be positioned to align with, and blind mate to, the coolant distribution manifold. When the server is slid into place in the server rack, the fluid connectors on the blind mating adapter fluidly couple to the corresponding mating fluid connectors on the coolant distribution manifold. The blind mating adapter unit functions as an intermediate layer for server and rack fluid mating.

20 Claims, 11 Drawing Sheets

BLIND MATING ADAPTING UNIT

FIELD OF THE INVENTION

Embodiments of the present invention relate generally to data center cooling. More particularly, embodiments of the invention relate to server racks, including installation and removal of server equipment that connects to a liquid cooling module.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

A server rack in a data center may contain servers and/or cooling distribution units having different types, sizes, gender, and location of liquid coolant connections. Typically, in a server rack, a coolant distribution unit couples to a coolant distribution manifold at the back of the server rack. Each server that requires liquid cooling will be connected to the coolant distribution manifold. The coolant distribution manifold often comprises a variety of interconnection hoses or a pair of distribution manifolds in the form of sealed square tubing with fluid connectors placed at fixed intervals along the tubing of the manifold. There are different types of rack manifold designs for server rack equipment connection sizes, locations, connector types, or genders. Servers and cooling distribution units in server racks require periodic service such that it is necessary to disconnect the liquid coolant connections at the back of the server rack to remove and service the server. Those connections are often deep in the back of the server rack and are not easily accessible.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In a first aspect, a blind mating adapter unit is configured to fluidly couple a server in an electronic rack to a coolant distribution manifold via blind mating. Blind mating happens via a sliding or snapping action which can be accomplished without wrenches or other tools. Blind mating can include self-aligning features which allow a small misalignment when mating. The blind mating adapter unit can be installed onto the server chassis and configured for alignment before inserting the server into the server rack. The fluid connectors on the blind mating adapter unit are initially configured to align with corresponding fluid connectors on the coolant distribution manifolds. The server can be repeatedly removed and reinstalled by blind mating without further adjustment.

The blind mating adapter unit can include an adapting plate and a mounting bar. The adapting plate can have a plurality of fluid connectors on a first side of the adapting plate and a plurality of fluid connection points on a second side of the adapting plate. Each of the plurality of fluid connectors on the first side of the adapting plate are configured to blind mate to a plurality of mating fluid connectors on one or more coolant distribution manifolds installed in a server rack. On the second side of the adapting plate, a fluid connection point can be a threaded hole into the material of the adapting plate, the threaded hole configured to receive a threaded adapter configured to fluidly couple one or more coolant lines, such as coolant supply line or coolant return line, to the adapting plate. In an embodiment, each of the fluid connection points on the second side of the adapting plate is configured to receive a manual fluid connection to at least one of the coolant lines of the cooling module. In an embodiment, each of the plurality of fluid connection points on the second side of the adapting plate is configured to be coupled to two coolant lines via a 2-into-1 connector. Each fluid connector on the first side corresponds one of the fluid connection points on the second side. In an embodiment, the cooling module inside the server can be furnished with existing fluid connectors. In such an embodiment, the adapting plate may not have fluid connection points on the rear of the adapting plate. The existing fluid connectors furnished with the server cooling module can be assembled to the adapting plate of the adapting unit.

The mounting bar can be adjustably coupled to the adapting plate. The mounting bar can be adjustably coupled to a frame that is coupled to a chassis of the server. The blind mating adapter is configurable to fix an alignment of the plurality of fluid connectors on the first side of the adapting plate to a plurality of corresponding mating fluid connectors on a coolant distribution manifold of the electronic rack. For example, when the server is installed into the electronic rack, the blind mating adapter unit with the fluid connectors is blind mated to the fluid connectors on the coolant distribution manifold, and the plurality of mating fluid connectors on the blind mating adapter unit on the server are fluidly coupled to the corresponding mating plurality of fluid connectors on the coolant distribution manifold. The adapting plate can be rotatably coupled to the mounting bar. The adapting plate can be rotatable within ±90°. In an embodiment, the adapting plate can be rotatable within ±180°. In an embodiment, the blind mating adapter can be adjustably coupled a frame that is adjustably coupled to the server chassis. In an embodiment, the location of the blind mating adapter unit on the server chassis is adjustable, using the frame, in a lateral direction (x-axis) and a vertical direction (y-axis) with respect to a direction facing into the electronic rack from the front or back of the electronic rack. In an embodiment, the adapting plate is separable into a first half and a second half. One or more of the plurality of fluid connectors of the first side of the adapting plate can be mounted to the first half, and the remaining of the plurality of fluid connectors are mounted to the first side the second half of the adapter plate. The first half can be slidably coupled to the frame using the mounting bar, and the second half can be slidably coupled to the frame with using a second mounting bar. In an embodiment, two horizontal members of the frame can be adjustable in length, and the two horizontal members of the frame form a parallelogram that forms a slope from one side of the server chassis to an opposing side of the server chassis, and the first and second half of the blind mating adapter are slidably coupled to the frame. The fluid connectors on the blind mating adapter unit can be dripless quick-connectors. Fluid connectors to the fluid connection points can be hose barb connectors.

In a second aspect, a server can include a cooling module having a coolant supply line, a heat transfer unit, and a coolant return line. The server can further include a blind mating adapter unit having a plurality of fluid connectors that are adjustably configurable to blind mate to a corresponding plurality of mating fluid connectors on a coolant distribution manifold, as described in the first aspect, above. The blind mating adapter unit can be installed onto the server chassis and configured for alignment before inserting the server into the server rack. Once the fluid connectors on the blind mating adapter unit are initially configured to align with corresponding fluid connectors on the coolant distribution manifolds, the server can be repeatedly removed and reinstalled by blind mating without further adjustment. In an embodiment, the blind mating adapter unit can be adjustably coupled to a frame that is adjustably coupled to the chassis of the server. The location of the blind mating adapter unit on the server chassis is adjustable, using the frame, in a lateral direction (x-axis) and a vertical direction (y-axis). In an embodiment, two horizontal members of the frame are adjustable in length, and the two horizontal members of the frame form a parallelogram that forms a slope of the two horizontal members from one side of the server chassis to an opposing side of the server chassis. The first and second half of the adapting plate can be slidably coupled to the frame. In an embodiment, the adapting plate of the blind mating adapter unit is configured to rotate within ±90° or within ±180°.

Figure 1:
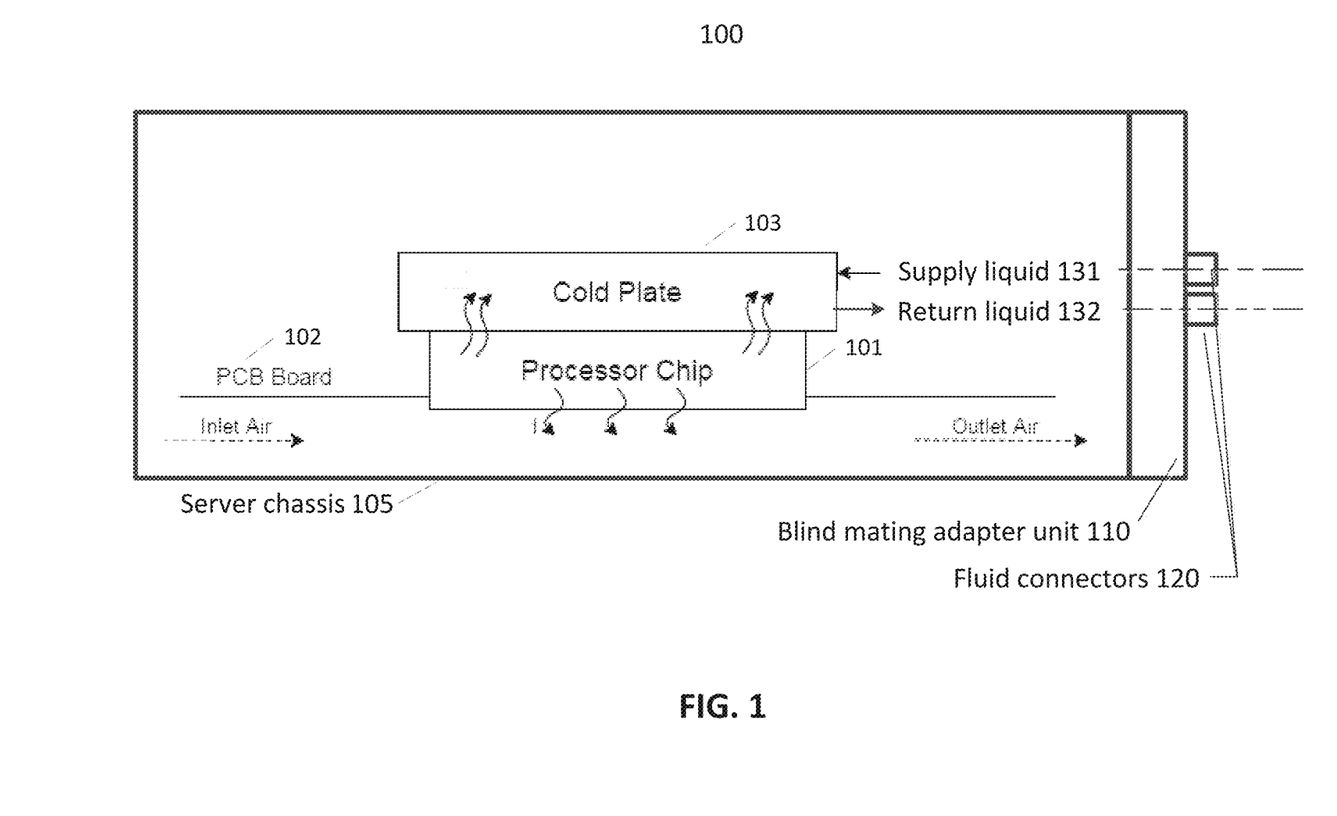
FIG. 1 is a block diagram illustrating an example of a cooling module configuration according to one embodiment.

FIG. 1 is a block diagram illustrating a portion of a server cooling module 100 according to one embodiment. The cooling module 100 can include a processor/cold plate assembly that removes heat from processor chip 101. Referring to FIG. 1, processor 101 is plugged onto a processor socket mounted on printed circuit board (PCB) or motherboard 102 coupled to other electrical components or circuits of a data processing system or server. Processor 101 includes a cold plate 103 attached to it, which is coupled to a rack manifold that is coupled to liquid supply line 132 and/or liquid return line 131. The coupling of the cold plate 103 to the rack manifold, via coolant lines 131 and 132, can be via the blind mating adapter unit described herein. A portion of the heat generated by processor 101 is removed by the cooling liquid lines 131 and 132 via cold plate 103. The remaining portion of the heat enters into an air space underneath or above, which may be removed by an airflow generated by a cooling fan (not shown). A blind mating adapter unit 110, as described herein, can be coupled to the server chassis 105 using a frame (not shown). The cold plate cooling liquid lines 131 and 132 can be coupled to the blind mating adapting unit 110 mounted to the frame on the server chassis to enable blind mating of the server's cooling lines to one or more coolant distribution manifolds in the server rack that house the server chassis 105. The liquid supply line 131 and liquid return line 132 can be hoses with either blind mating connectors or manual mating connectors. The cooling module 100 included in the server chassis 105 may be used in different types of servers and server racks. Blind mating adapter unit 110 can ensure proper mating and configuration for the fluid systems between the server rack and the cooling module(s) in the server.

Figure 2A:
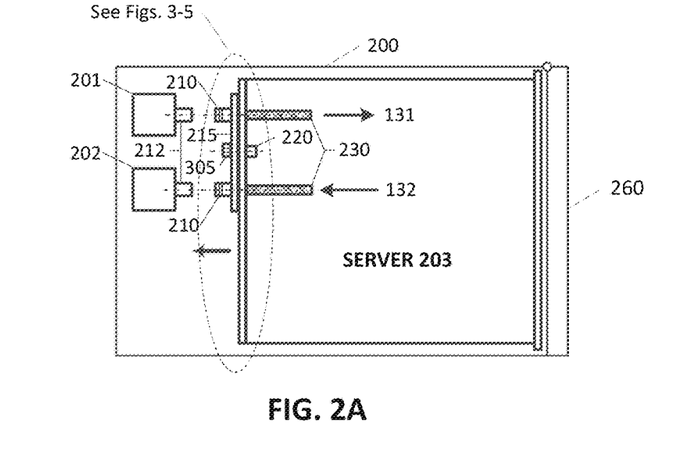
FIGS. 2A and 2B illustrate plan views of various embodiments of a blind mating adapter for use in a server chassis, according to some embodiments.
Figure 2B:
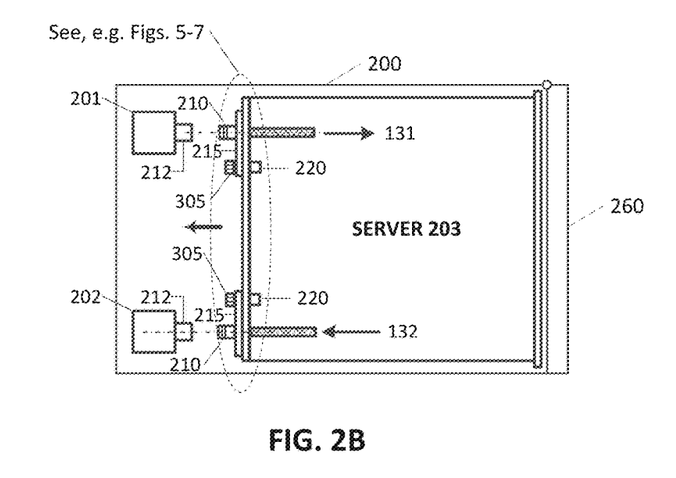

FIGS. 2A and 2B illustrate plan views of various embodiments of a blind mating adapter unit for use on a server 203 in a server rack 200 having a coolant distribution manifold 201 and 202 (collectively, 201/2), according to some embodiments. The blind mating adapter unit enables a piece of information technology (IT) equipment, such as a server 203, to be slid into the server rack 200 and blind mated to a portion of the fluid connectors on the coolant distribution manifolds 201/2 via the blind mating adapter unit. The fluid connectors 210 on the blind mating adapter unit are initially configured to align according to corresponding fluid connectors on the coolant distribution manifolds 201/2. The server 203 can be repeatedly removed from the server rack and reinstalled by blind mating, without further adjustment. In an embodiment, the blind mating adapter unit is installed into the server 203 chassis and configured for alignment before inserting the server 203 into the server rack. The blind mating adapter unit enables blind mating to fluid connectors on server rack coolant distribution manifolds for different cooling modules in a server chassis and different rack designs.

Referring now to FIG. 2A, a server 203 is illustrated that has a cooling module (not shown) included within the server 203 as described above, with reference to FIG. 1. The cooling module is described above with reference to FIG. 1. The cooling module within the server 203 may include one or more hoses, tubes, or piping such as for a coolant supply line 131 and a coolant return line 132, or other coolant line, that are fluidly coupled at one end to the cooling module (not shown) in the server 203. The other end of each of the coolant supply 131 and coolant return lines 132 can be manually coupled to the blind mating adapter unit, as described herein and with reference to FIGS. 3-10. In one embodiment, if the server liquid cooling module lines 131 and 132 are only equipped with manual mating connecters, then the blind mating adapter unit with blind mating fluid connectors is needed. In this embodiment, the blind mating fluid connectors 210 will be on one end of the blind mating adapting plate. The other end of the blind mating adapting plate will have manual fluid connection points (not shown) for connecting the coolant lines 131 and 132 to the liquid cooling module in the server and the blind mating adapting plate. Accordingly, the coolant lines 131 and 132 can also include manual fluid connectors on their ends. The blind mating adapter unit is equipped with connectors designed for blind mating on one side and manual mating to the coolant lines 131 and 132 on the other side.

A blind mating adapter unit can include a plurality of fluid connectors 210 on a first side of an adapting plate 215 of the blind mating adapter unit. Coolant supply line 131 can be manually coupled to a fluid connection point on a second side of the adapting plate 215 of the blind mating adapter unit. Coolant return line 132 can be manually coupled to a fluid connection point on a second side of the adapting plate 215 of the blind mating adapter unit. Each fluid connection point on the second side of the adapting plate 215 corresponds to a fluid connector 210 on the first side of the adapting plate 415. If the ends of the coolant lines 131 and 132 are already equipped with blind mating connectors, then these blind mating connectors are assembled to the blind mating adapter unit, and the blind mating adapter unit is used for fixing and positioning the blind mating connectors to a proper configuration to match rack coolant distribution manifold blind mating configurations.

The adapting plate 215 can be adjustably mounted to the chassis of the server 203 using a mounting bar 220 and frame (not shown). In an embodiment, adapting plate 215 can be rotatably coupled to the mounting bar with fastener 305. The mounting bar 220 can be slidably coupled to a frame that is adjustably coupled to a chassis of the server, such that the adapting plate 215 and mounting bar 220 are slidably coupled to the server chassis. In such an embodiment, the server cooling module may only provide hoses to and from a cooling loop inside of the server 203, such as coolant supply 131 and coolant return 132. The provided hoses are intended to be manually connected, by an end user, to coolant distribution manifolds 201 and 202 (collectively, 201/2). However, as described herein, the hoses are, instead, manually coupled to the blind mating adapting unit described herein. In this embodiment, the blind mating adapter unit can be slidably mounted to a frame that attaches to the server chassis, using mounting bar 220 and fastener 305. The hoses 230 provided by the server manufacturer are manually coupled to one side of the blind mating adapter unit, and the blind mating adapter unit is then fixed to the frame and the frame is attached to the server chassis. During initial installation, the blind mating adapter unit is slid into position to align with the coolant distribution manifolds 201/2. The adapting plate 215 can be rotated or otherwise adjusted, such as by using a split-plate adapting plate 215, to align the fluid connectors 210 on the blind mating adapter to corresponding mating fluid connectors on the coolant distribution manifolds 201/2. The split plate adapting plate 215 is described below with reference to FIG. 2B. The adapting plate 215 and mounting bar 220 can be fixed to align the plurality of fluid connectors 210 with a corresponding mating plurality of fluid connectors 212 on the coolant distribution manifolds 201/2. The fluid connectors 210 on the blind mating adapter unit remain fixed in position so that the server 203 may then be slid into a rack on the server rack 200, thereby blind mating the server 203 to the coolant distribution manifolds 201/2. The server 203 can also be removed from the rack, and reinstalled into the rack without readjusting the alignment of the fluid connectors 210 on the blind mating adapter unit. Fluid connectors 212 are built into coolant distribution manifolds 201/2. The server 203 can be installed into different racks and be operated properly on different racks with different blind mating adapters, while keeping the server cooling module unchanged. In one embodiment, as described above, if the cooling module of the server is equipped with blind mating connectors on its coolant supply and return lines, then it is necessary to make sure the rack coolant distribution manifolds 201/2 have fluid connectors 212 that are compatible with the coolant supply and return lines 131 and 132. The blind mating adapter unit fixes the configuration and location of the server cooling module fluid connectors 210 to mate properly to the corresponding mating plurality of fluid connectors on rack coolant distribution manifolds 201/2. In another embodiment, if the sever cooling module (not shown) is equipped with manual mating connectors, then the blind mating adaptor unit can be equipped with a first type of blind mating connectors 210 on one end to match with corresponding blind mating connectors on the rack coolant distribution manifolds 201/2 and manual connection points (not shown) for coupling the coolant module supply and return lines 131 and 132 to the blind mating adapter unit. In this embodiment, the blind mating adapter enables more interoperability between server cooling modules and different configurations of coolant distribution manifolds 201/2.

Referring now to FIG. 2B, the split-plate embodiment of the blind mating adapter unit is now described with reference to FIG. 2B, and FIGS. 5-7, below. Such an embodiment is useful for providing more flexible solutions to match rack coolant distribution manifolds and server cooling module designs. In such an embodiment, the adapting plate 215 is separable into a first half and a second half. In the embodiment of FIG. 2B, a first side of the first half of the adapting plate 215 has a fluid connector 210 corresponding to mating connector 212 on the coolant distribution manifold 201. Coolant supply line 131 can be manually coupled to a fluid connection point on the second side of the first half of the adapting plate 215. The first half of the adapting plate 215 can be adjustably coupled to a chassis of server 203 using mounting bar 220, frame (not shown), and a fastener 305. In an embodiment, the first half of the adapting plate 215 and the mounting bar 220 can be slidably coupled to the frame that attaches the adapting plate 215 and mounting bar 220 to the server chassis. Fluid connector 210 can be aligned with a corresponding mating fluid connector 212 on coolant distribution manifold 201 by adjusting the location of the first half of the adapting plate 215 and mounting bar 220.

The second half of the adapting plate 215 can similarly have a fluid connector 210 corresponding to mating connector 212 on the coolant distribution manifold 201. Coolant return line 132 can be manually coupled to a fluid connection point (not shown) on the second side of the second half of the adapting plate 215. The second half of the adapting plate 215 can be adjustably coupled to a chassis of server 203 using mounting bar 220, a frame (not shown), and fastener 305. In an embodiment, the second half of the adapting plate 215 and a second mounting bar 220 can be slidably coupled to the frame that attaches the second half of the adapting plate 215 and second mounting bar 220 to the server chassis. Fluid connector 210 can be aligned with a corresponding mating fluid connector 212 on coolant distribution manifold 202 by adjusting the location of the second half of the adapting plate 215 and second mounting bar 220.

Figure 3:
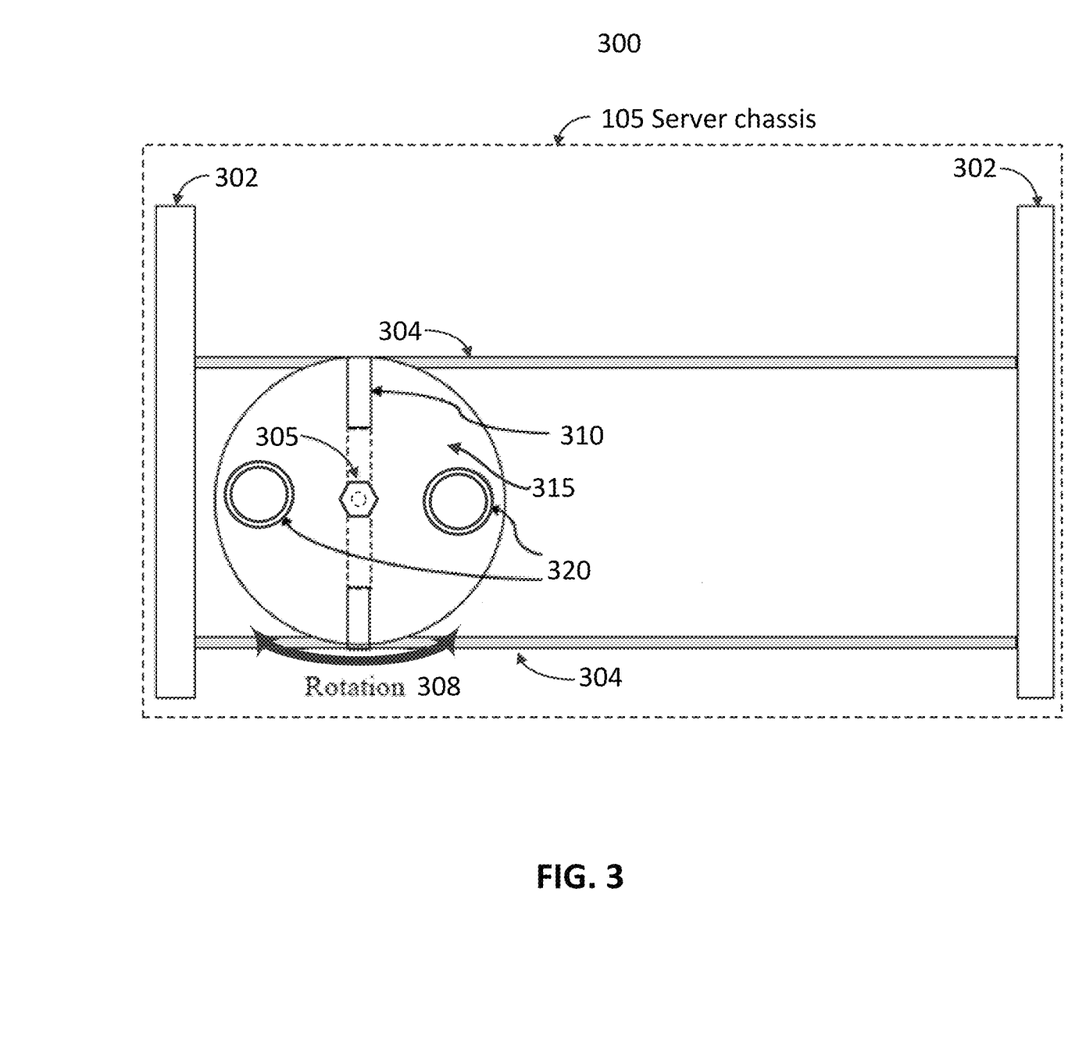
FIG. 3 illustrates an end view of a rotatable blind mating adapter for use in a server chassis, according to one embodiment.

FIG. 3 illustrates an end view of a rotatable blind mating adapter unit 300 for use in a server, according to one embodiment. The view is from the rear of the server rack in which the server chassis 105 is installed. The server is installed from the front of the server rack, and slid into place inside the server rack. Upon sliding the server into the server rack, the fluid connectors 320 on the blind mating adapter unit 300 couple to corresponding mating fluid connectors on coolant distribution manifolds 201/202 (not shown) in the rear of the server rack. The fluid connectors 320 on the blind mating adapter unit are initially configured to align with corresponding fluid connectors on the coolant distribution manifolds (not shown). The server can be removed and reinstalled by blind mating without further adjustment. In an embodiment, the blind mating adapter unit is installed onto the server chassis and configured for alignment before inserting the server into the server rack.

Dashed line 105 represents a chassis of the server. Blind mating adapter unit 300 can include mounting bar 310, adapting plate 315, fluid connectors 320, and fastener 305. Adapting plate 315 can be rotatably coupled to mounting bar 310 using fastener 305. Fastener 305 can be any type of threaded fastener, or other mechanical fastener. Fastener 305 can be loosened to permit adapting plate 315 to rotate with respect to mounting bar 310.

Adapter unit 315 can be of a cast or forged metal of sufficient strength and thickness to drill and tap into both a front and rear face of the adapting plate 315. As an example, in FIG. 2A, above, the face of the adapting unit 315 (215, in FIG. 2A) that faces the coolant distribution manifold 201/2 is shown with quick connect fittings coupled to the adapting plate 215/315. Such quick connect fittings can be threaded into the first side (in FIG. 3, the front side) of the adapting plate 315 that faces the coolant distribution manifold, e.g. 201/2. The server contains a cooling module or other fluid system that, in an embodiment, is to be manually coupled to fluid connection points on a second side of the adapting plate 215/315 (here, the rear side, not shown). For example, the server cooling module may have been provided with one or more hoses, tubes, or pipes intended to be manually coupled to coolant distribution manifolds (not shown). Instead, as described herein, the provided hoses, tube, or pipes are manually coupled to the fluid connection points on the second (rear) side of the adapting plate 215/315. Each fluid connection point on the second (rear) side of the adapting plate 215/315 corresponds with one of the fluid connectors 320 provided on the first (front) side of the adapting plate 215/315. A fluid connection point on the rear side of the adapting plate can be a barb hose connection that connects the coolant line hose (not shown) to the server cooling module (not shown) in the server. In this embodiment, the cooling module is designed with manual mating connectors on the ends of the coolant supply and return hoses, e.g., through barb-hose connections.

Adapting plate 315 can be rotatably coupled to mounting bar 310 with fastener 305. Mounting bar 310 can have an approximately C-shaped cross-section with the "C" facing up toward the adapting unit, as indicated by the dashed lines represented the void area of the C-shaped cross-section of the mounting bar near the center of the adapting plate 315. The void area in the mounting bar 310 permits room for access to hose couplings, fittings, hose, and tool access to the hose, couplings, and fittings. A threaded tapping, or other mechanical connection point, in the center of the C-shape of the mounting bar receives threaded fastener 505, or other mechanical connection type, to couple the adapting plate 315 to the mounting bar 310. When fastener 305 is loosened, adapting plate 315 is free to rotate clockwise or counterclockwise, as shown by rotation 308. In an embodiment, fastener 305 can be removed, and the adapting plate 315 is free to rotate ±180° or more, when pulled out from the mounting bar, as described below with reference to FIG. 10.

Blind mating adapter unit 300 can further include a frame coupled to the chassis of the server to enable adjusting of the location of the blind mating adapter unit 300 using the frame. One or more frame members 302 can be installed on each of two opposing sides of the server chassis 105, e.g. a left and a right side, with respect to a front of the server rack (not shown). Vertical members 302 permit horizontal members 304 to be adjusted vertically, i.e. in a y-axis direction. Horizontal members 304 can provide slidable adjustment of the blind mating adapter 300 in an x-axis, i.e., from left side to right side, with reference to a front of the server rack. Members 302 and 304 can made from slidable channel, such as, square tube, angle brackets, or other shape of sufficient strength to support the span across the sever rack width and the force applied to the server chassis 105 in seating the fluid connectors 320 to make a connection between fluid connectors on a coolant distribution manifold (not shown) and the blind mating adapter unit 300. In an embodiment, frame members are made from stainless steel such as type 304 or 316, aluminum, or anodized material, or painted, or other corrosion resistant material.

Figure 4:
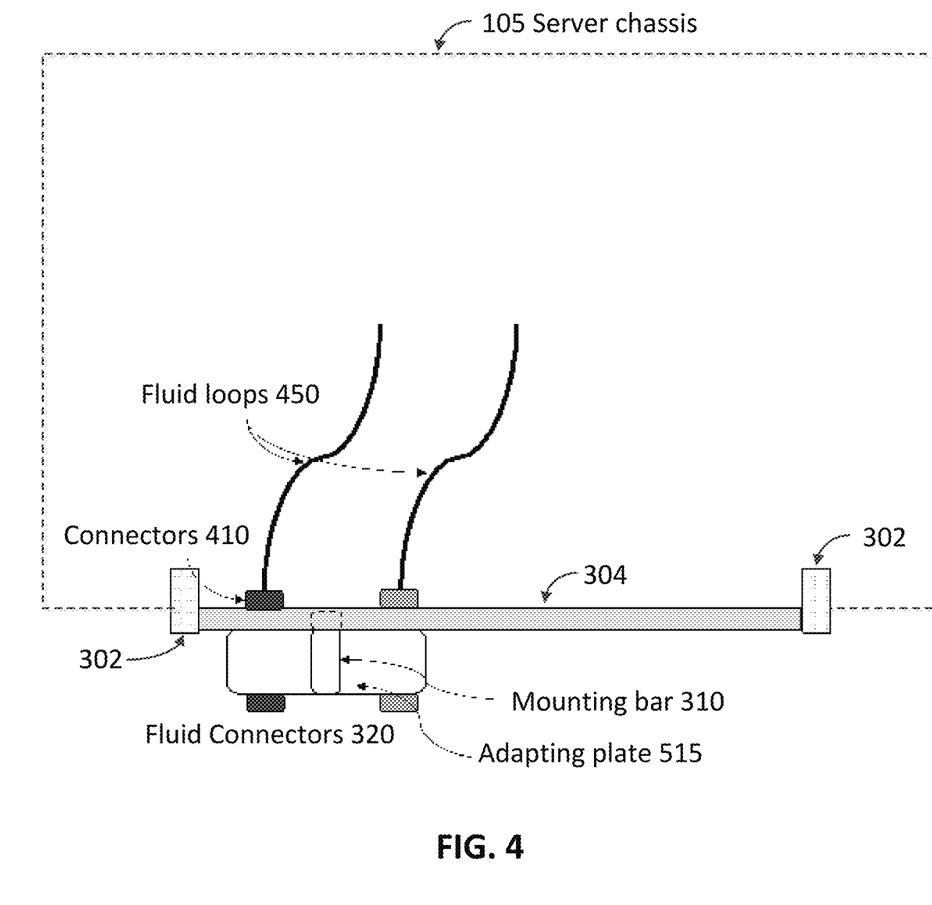
FIG. 4 illustrates a plan view of a rotatable blind mating adapter for use in a server chassis, according to one embodiment.

FIG. 4 illustrates a plan view of a rotatable blind mating adapter unit for use on a server chassis 105, according to one embodiment. Frame members 302 and 304 are used to attach the blind mating adapter unit to the server chassis 105. Frame members 302 and 304, and mounting bar 310, are described above with reference to FIG. 3 and will not be described again here.

Referring back to FIGS. 2A and 2B, the server chassis 105 does not have its own fluid connectors installed at the rear of the server 203 chassis. Thus, a frame is attached to the server chassis 105 and a blind mating adapter unit is coupled to the frame. In this embodiment, fluid loops 450 refer to a fluid supply line (e.g. 131) to, and fluid return line (e.g. 132) from, a cooling module inside of the server chassis 105. The fluid loops 450 manually couple to fluid connection points on the rear side (the fluid loops 450 side) of the adapting plate 315 of the blind mating adapter unit. In an embodiment, fluid loops 450 are coupled to adapting plate 315 of blind mating adapter unit using connectors 410. Fluid connectors 320 are facing toward coolant distribution manifolds (not shown). Connectors 320 are selected to mate to fluid connectors (not shown) attached to the coolant distribution manifolds (not shown). A fluid connection point on the rear side of the adapting plate can be a barb hose connection that connects the coolant line hose to the server cooling module in the server. In an embodiment, the fluid loops 450 may be provided with fluid connectors that can be coupled to adapting plate 315 as fluid connectors 520. For example, connectors 410 and 320 can be one part with two ends 410 and 320. If 410 is a barb hose connection, then the fluid connectors 320 can be preassembled with the server cooling module. If connectors 410 are manual connectors, then connectors 410 can be understood as a manual connections coupling one end of each coolant line to the rear side of the adapting plate of the blind mating adapter. The other end of the each of the coolant lines is coupled, e.g. preassembled, to the cooling module in the server chassis 105.

Figure 5:
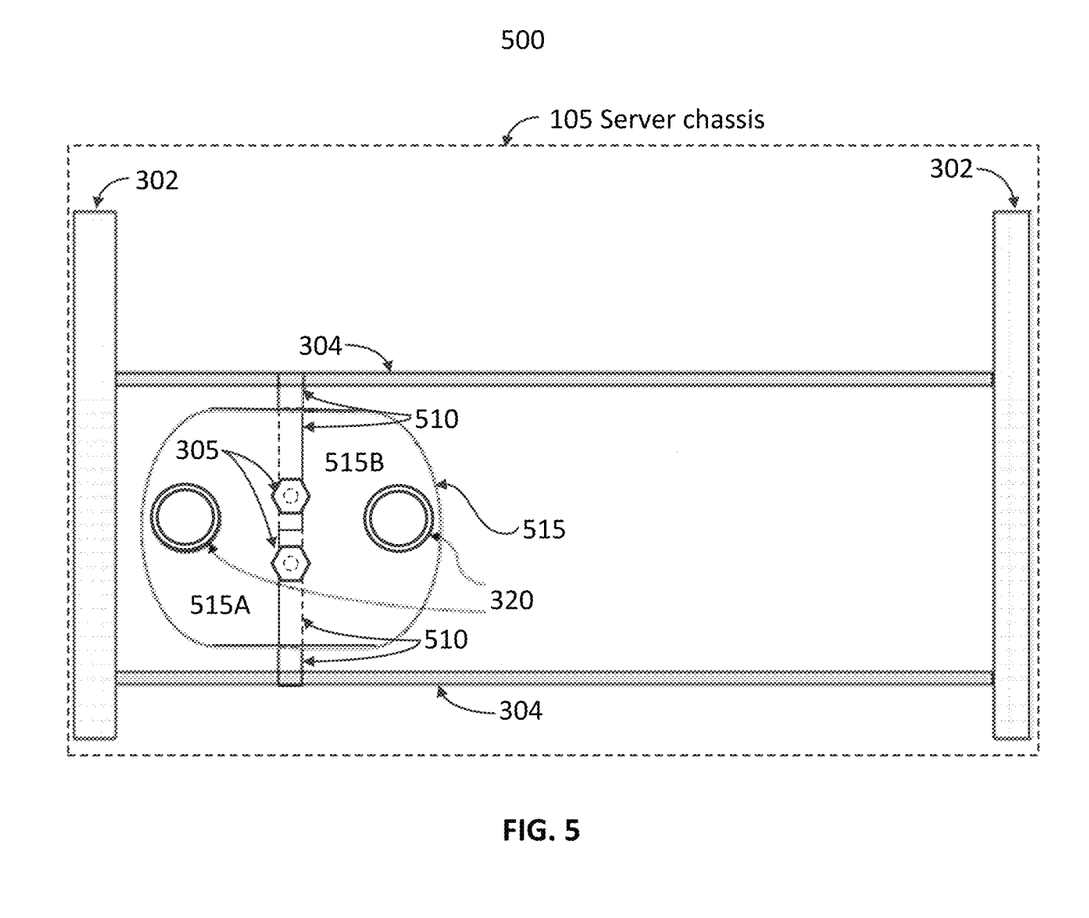
FIG. 5 illustrates an end view of a split-plate blind mating adapter for use in a server chassis, according to one embodiment.
Figure 6:
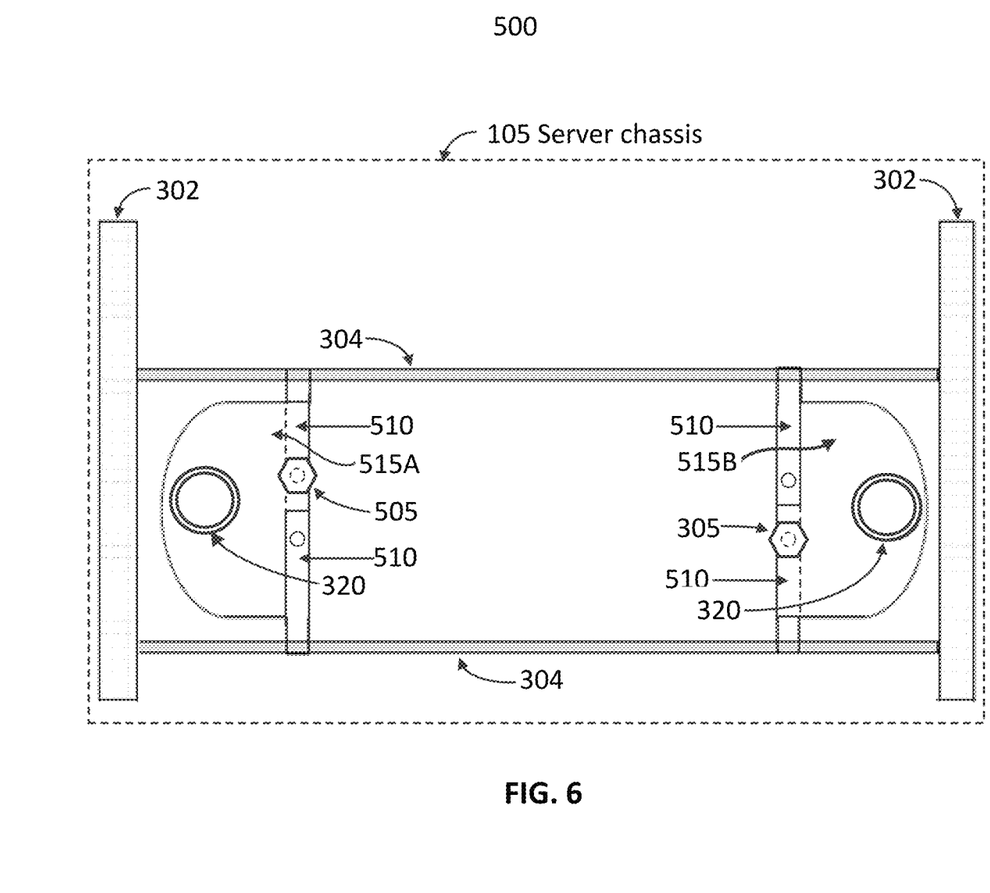
FIG. 6 illustrates an end view of a split-plate blind mating adapter, having been split and adding an additional mounting adapter, for use in a server chassis, according to one embodiment.
Figure 7:
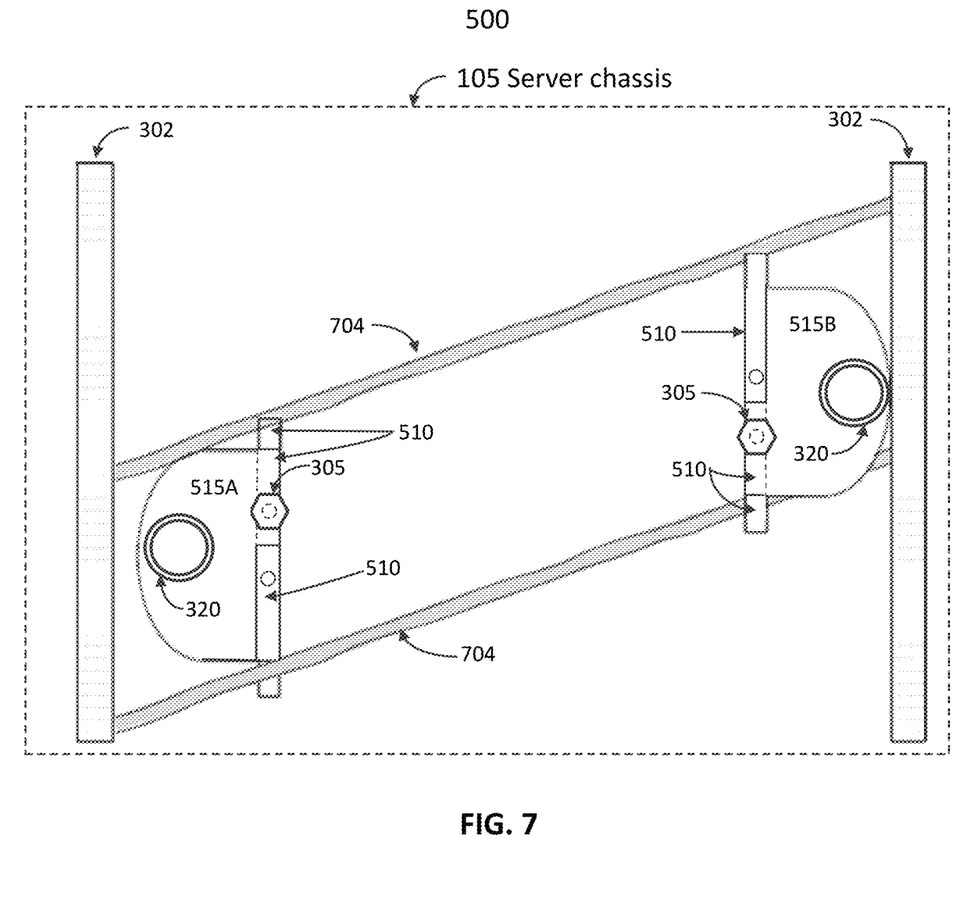
FIG. 7 illustrates an end view of a split-plate blind mating adapter, having been split and adding an additional mounting adapter, for use in a server chassis, according to one embodiment.

FIG. 5 through FIG. 7 illustrate an end view of a split-plate blind mating adapter unit 500 for use in a server chassis 105, according to one embodiment. The view is from the rear of the server rack in which the server chassis 105 is installed. The server chassis is installed from the front of the server rack, and slid into place inside the server rack. Upon sliding the server chassis 105 into the server rack, the fluid connectors 320 on the blind mating adapter unit fluidly couple to corresponding mating fluid connectors on coolant distribution manifolds (not shown) in the rear of the server rack. The fluid connectors 320 on the blind mating adapter unit are initially configured to align with corresponding fluid connectors (not shown) on the coolant distribution manifolds (not shown). The server chassis 105 can be removed and reinstalled by blind mating without further adjustment. In an embodiment, the blind mating adapter unit is installed onto the server chassis using a frame and configured for alignment with the corresponding mating fluid connectors (not shown) on the coolant distribution manifolds (not shown) before inserting the server chassis 105 into the server rack.

Dashed line 105 represents a chassis of the server. Frame members 302 and 304 are coupled to server chassis 105. Frame members 302 and 304, fastener 305 and fluid connectors 320 are described above with reference to FIG. 3 and will not be described again here. A plan view of an example of this split-plate blind mating adapter unit 500 is described above with reference to FIG. 2B. The blind mating adapter unit 500 is used to configure the server side connectors to be blind mated to the rack coolant distribution manifold (not shown).

Still referring to FIG. 5, in this embodiment, blind mating adapter unit 500 includes adapting plate 515 and mounting bar 510. Adapting plate 515 can be split into two sections 515A and 515B. Before splitting the adapting plate 515, both sections 515A and 515B may be fastened to mounting bar 510. Mounting bar 510 differs from mounting bar 310 at least in that there are two threaded taps, or other mechanical connection, in the mounting bar 510 to receive the two fasteners 305. When adapting plate 515 is split into two sections, each of sections 515A and 515B receives its own mounting bar 510, as shown in FIG. 6.

Referring now to FIG. 6, the blind mating adapter unit 500 of FIG. 5 is shown with the adapting plate 515 split into two sections 515A and 515B ("split plate blind mating adapter unit"). The split plate embodiment enables changes to the horizontal distance between the two connectors 320 on the adapting plate 515. The split plate embodiment can be used for blind mating with different rack coolant distribution manifolds (not shown) in which the supply and return lines of the server cooling module are separated by a different distance than the separation of the rack manifolds. For example, rack manifolds 201 and 202 (not shown) may not be completely located on either of the two sides of the server rack, and the distance between the rack manifolds may vary even if both rack manifolds are located on one side of the rear of the server rack.

Adapting plate sections 515A and 515B may each be slidably adjusted to a location that aligns with a fluid connector (not shown) on a coolant distribution manifold (not shown). Referring back to FIG. 2B, adapting plate section 215/515A can have a fluid connector 210/320 that mates to a corresponding connector 212 on coolant distribution manifold 201/2. The fluid connector 210/320 on adapting plate section 515A/215A is aligned with the mating fluid connector 212 on coolant distribution manifold 201. The other (rear) side of adapting unit section 515A can be manually coupled to, e.g., coolant supply line 131 using a fluid connection point that corresponds to fluid connector 210/320 on the front side of the adapting plate 515A. Similarly, fluid connector 320 of adapting plate section 515B can be adjustably coupled to a second mounting bar 510 and aligned to a mating fluid connector 212 of coolant distribution manifold 202. The other (rear) side of adapting plate 515B can be manually coupled to, e.g., coolant return line 132 of a cooling module inside server chassis 105. The coolant return line 132 can be coupled to the rear of the adapting plate 515B unit using a fluid connection point on the rear side of the adapting plate 515B. The fluid connection point corresponds to the fluid connector 320 on the front of the adapting plate 515B.

Referring now to FIG. 7, an embodiment for a split-plate blind mating adapter unit 500 is described for applications wherein one mating fluid connector on the coolant distribution manifold may be higher or lower than the other fluid connector of coolant distribution manifold. Similarly, in an embodiment, the server cooling module may require a coolant supply port to be lower than a coolant return port. Here, horizontal frame members 704 can be used in lieu of horizontal frame members 304. Horizontal frame members 704 can be extendible such that one side of the horizontal members 704 is higher than the other, to align the fluid connectors on the adapting plates 515A and 515B with the mating fluid connectors on the coolant distribution manifold (not shown). In this embodiment, bendable corner or angle brackets (not shown) can be used to couple horizontal members 704 to vertical members 302. This embodiment is to blind mate the server chassis fluid connectors with fluid connectors of the rack coolant distribution manifolds when the rack coolant distribution manifold fluid connectors are arranged in a staggered manner. In an embodiment, the existing rack manifold may have only two connectors, e.g. supply and return line, available and the two available fluid connectors on the rack manifold are not parallel horizontally.

Figure 8:
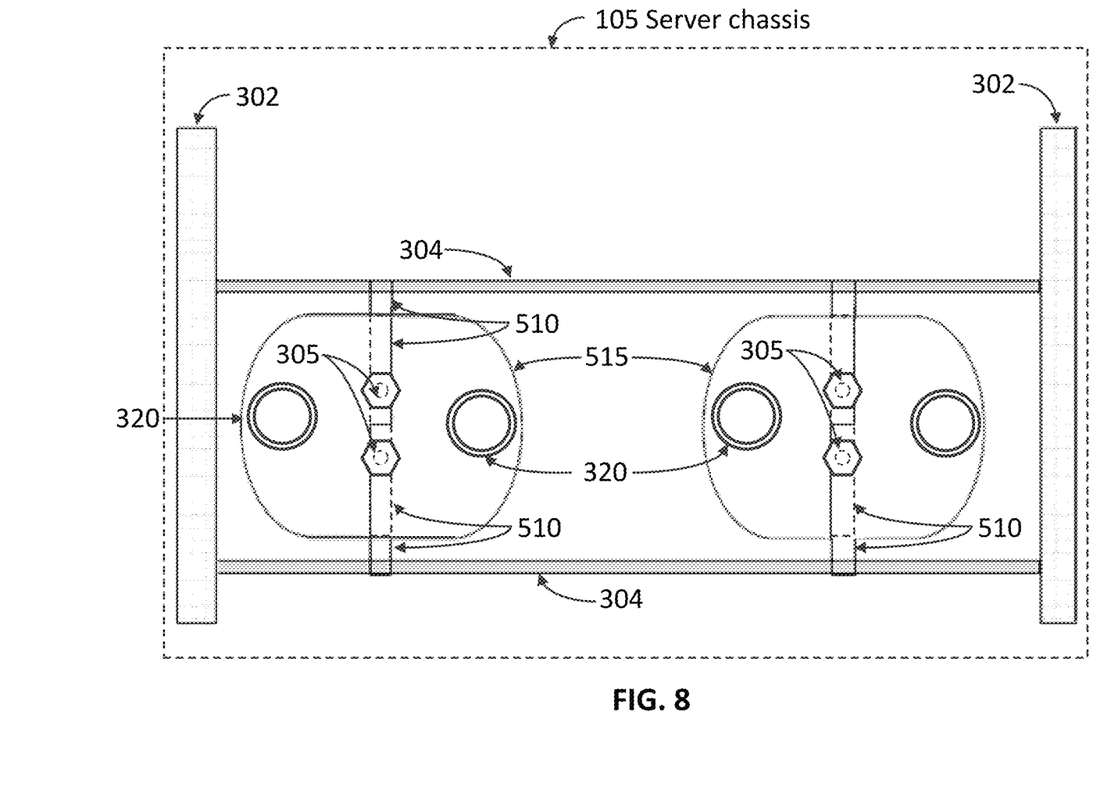
FIG. 8 illustrates an end view of a two split-plate blind mating adapter, having be split and adding an additional mounting bar, for use in a server chassis, according to one embodiment.

FIG. 8 illustrates an end view of two split-plate blind mating adapter units, for use in, e.g., blind mating coolant supply and return lines for two separate cooling modules within a single server. The view is from the rear of the server rack in which the server chassis 105 is installed. The server chassis 105 is installed from the front of the server rack, and slid into place inside the server rack (not shown). Upon sliding the server chassis 105 into the server rack, the fluid connectors 320 on the blind mating adapter units fluidly couple to corresponding mating fluid connectors on coolant distribution manifolds (not shown) in the rear of the server rack. Dashed line 105 represents a chassis of the server. A plan view of an implementation of FIG. 8 would be substantially identical to FIG. 2A, except using two split-plate blind mating adapters of FIG. 5 instead of one blind mating adapter 300 of FIG. 3.

Figure 9:
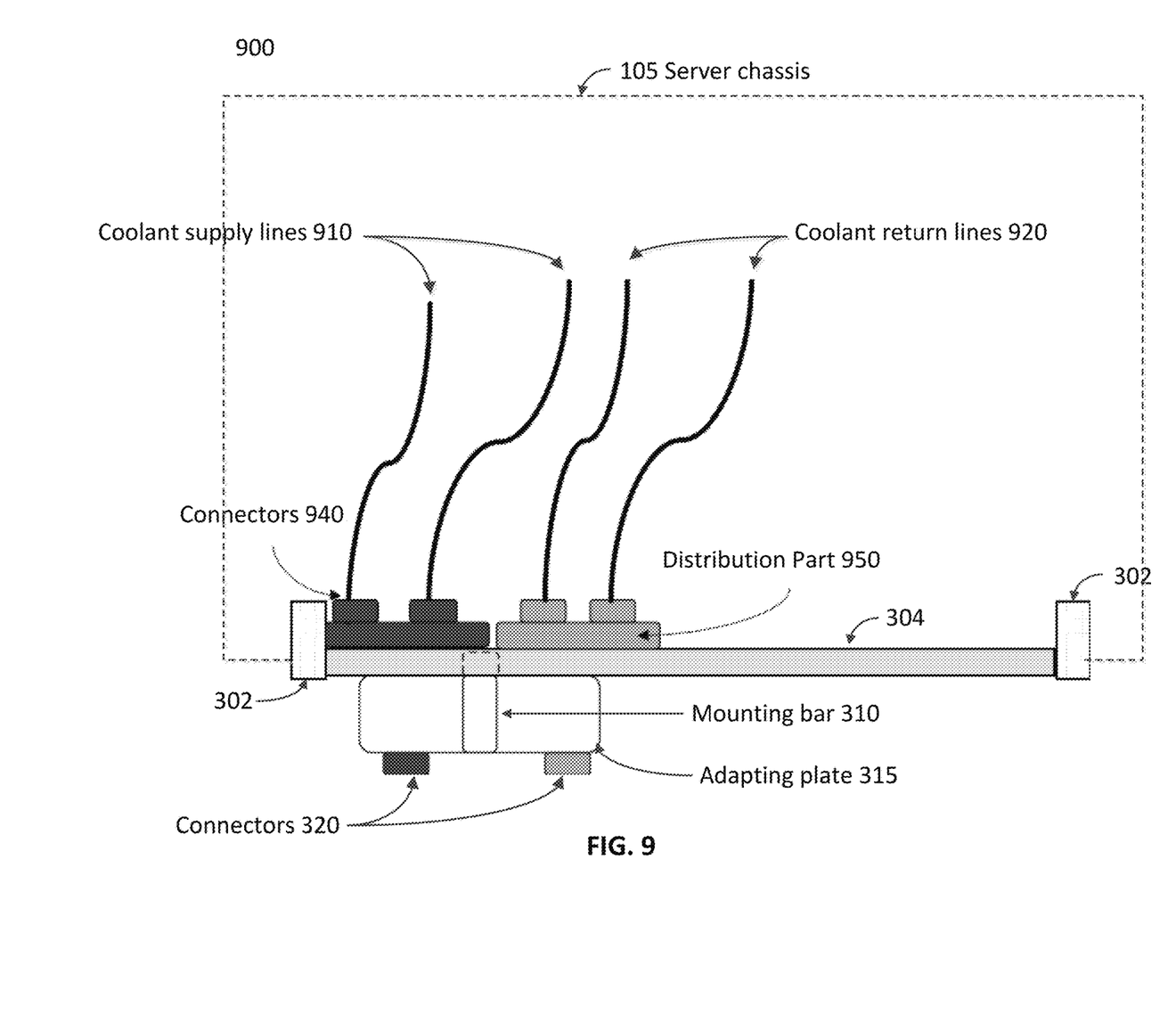
FIG. 9 illustrates a plan view of a blind mating adapter that supports cooling loops for multiple cooling modules, according to one embodiment.

FIG. 9 illustrates a plan view of a blind mating adapter unit 900 that supports multiple cooling loops, according to one embodiment. This design is to add additional features that the blind mating adapter unit can be used to adapt the fluid connectors 320 for use with two cooling loops within a same server. The multiple coolant loops can be manually connected to the blind mating adapter unit using distribution part 950 and connectors 940. In embodiments of FIG. 9, frame elements 302 and 304, mounting bar 310, and adapting plate 315 are the same as described above with reference to FIG. 3 and will not be described again here. Dashed line 105 represents an outline of the chassis of server. The fluid connectors which will be used on the blind mating adapter unit can be customized with features. For example, one side of an adapting plate of the blind mating adapter unit can have fluid connectors 320 that blind mate to the corresponding mating fluid connectors on the rack manifolds (not shown), and the coolant loops inside the server chassis 105 can be manually coupled to the other side of the adapting plate. In another example, the one side of the adapting plate can have fluid connectors 320 that blind mate to the corresponding mating fluid connectors on the rack manifolds, and the coolant lines inside the server chassis can couple to the adapting plate using the distribution part 950 and connectors 940 as shown in FIG. 9.

At a rear side (the side with coolant supply lines 910 and 920) of adapting plate 315, blind mating adapter unit 900 can receive two pair of coolant loop lines: two coolant supply lines 910 and two coolant return lines 920. Coolant supply lines 910 can be manually coupled to a 2-into-1 distribution part 950 using connectors 940. Similarly, coolant return lines 920 can be coupled to a 2-into-1 distribution part 950 using connectors 940. In an embodiment, adapting plate 315 can be specially bored for smooth fluid flow between the 2-into-1 fluid transitions of the blind mating adapter 900.

Such an embodiment may be useful when a server has two independent cooling loops, such as for redundancy or for different processor types or different areas within one server. Left fluid connector 320 can receive coolant that is to be distributed to both coolant supply lines 910. Right fluid connector 320 can receive both coolant return lines 920 and discharge them through connector 320 back to coolant distribution manifolds (not shown). In this embodiment, the blind mating adapter unit 900 is mounted to the rear of the server chassis 105. Fluid connectors 320 can be aligned with, e.g., corresponding mating fluid connectors of coolant distribution manifolds (not shown).

Figure 10:
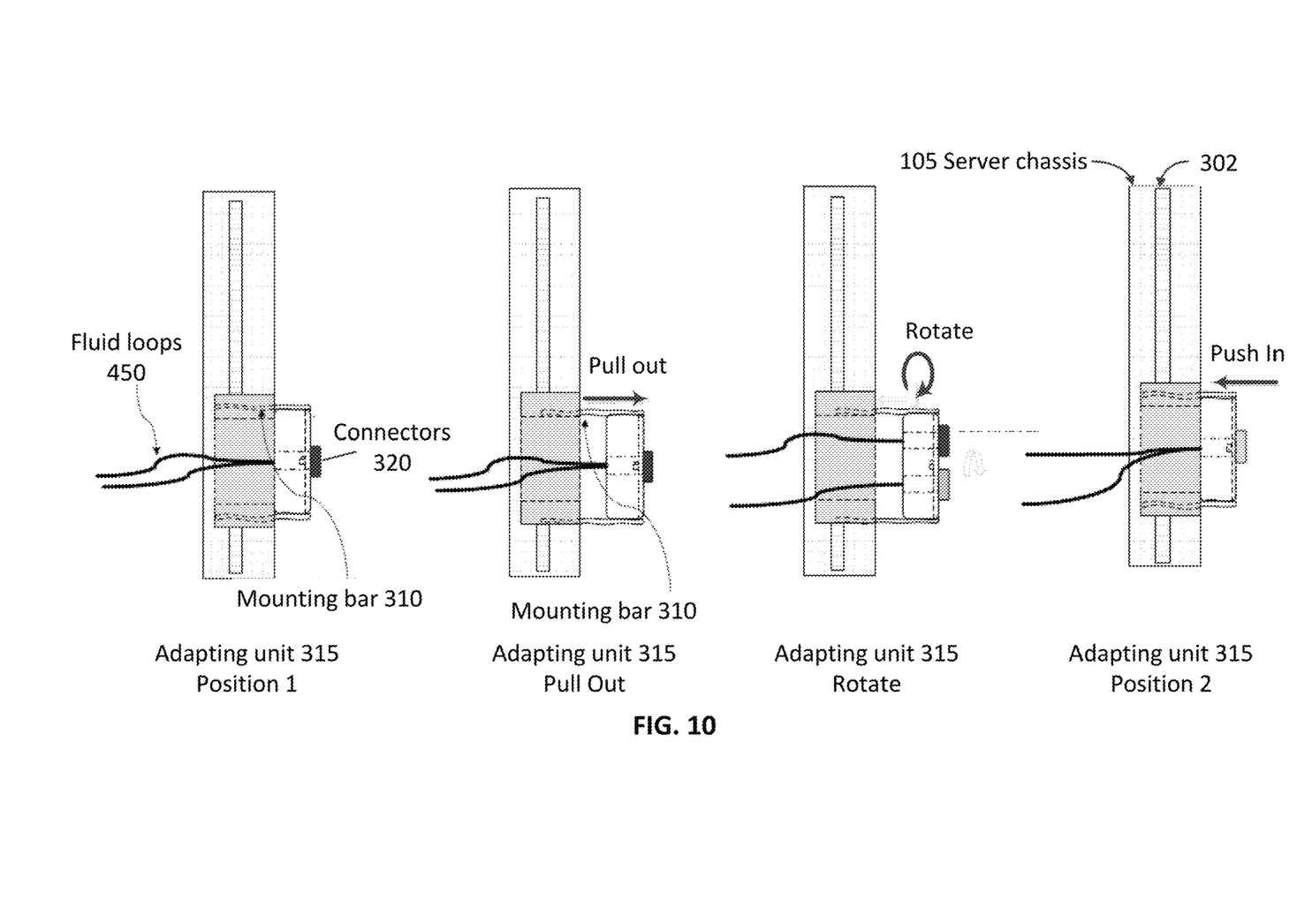
FIG. 10 illustrates a side view of a rotatable blind mating adapter being rotated during operation, according to an embodiment.

FIG. 10 illustrates a side view of a rotatable blind mating adapter unit being rotated during operation, according to an embodiment. Server chassis 105, vertical member 302, fluid connectors 320, mounting bar 310, adapting plate 315 have been previously described above with reference to FIGS. 2A, 2B, 3, and 4, and will not be described again here.

In this embodiment, the mounting bar 310 and adapting plate 315 can be pulled out such that the adapting plate 315 can be rotated ±180° or more to reverse the orientation of the coolant supply and coolant return line. With ±180° rotation, a location of the coolant supply and return lines is inverted. In an embodiment, adapting plate 315 can be rotated continuously to any rotation within ±180°. In another embodiment, adapting plate can be rotated in fixed increments determined by a design of the mounting bar and adapting plate 315. The adapting unit 315 and mounting bar 310 can be pushed back into position and fixed into place with a fastener (described above, and not shown here). In an embodiment, adapting plate 315 can be rotated ±90° to accommodate horizontally mounted server rack coolant distribution manifolds (not shown).

Figure 11A:
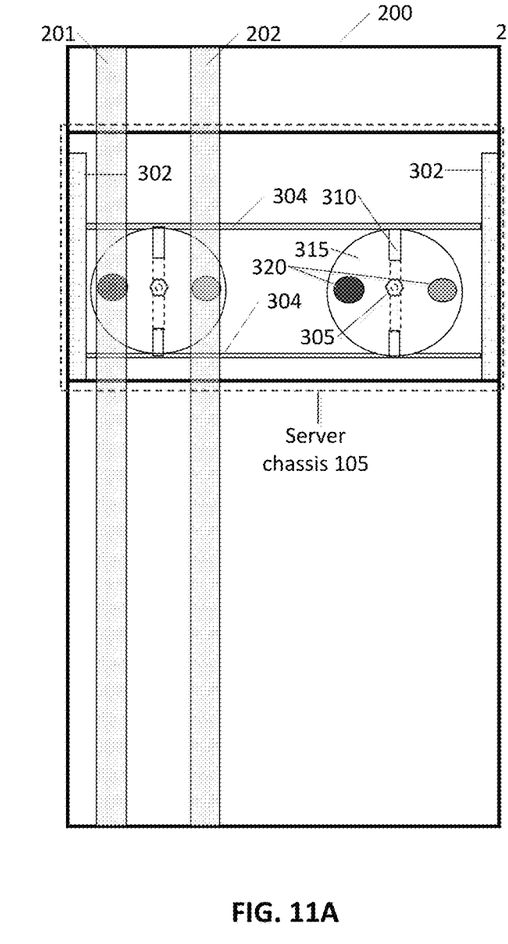
FIGS. 11A-11C illustrate a view from the back side of the server racks of a plurality of different configurations in which the blind mating adapter unit can be used in a server, according to some embodiments.
Figure 11B:
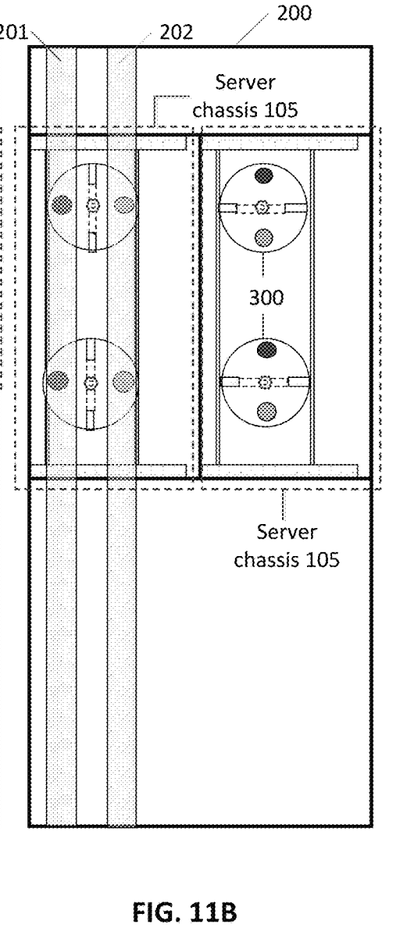
Figure 11C:
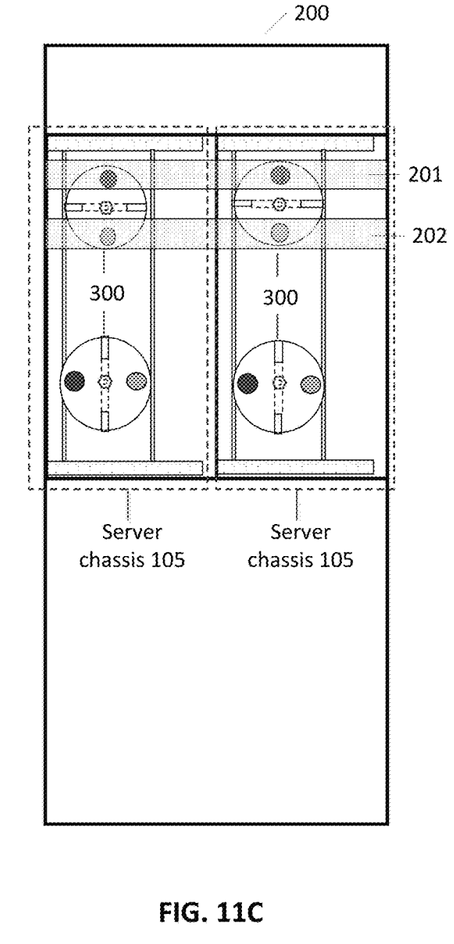

FIGS. 11A through 11C illustrate views of the rear of the server racks 200 of a plurality of different configurations in which a blind mating adapter unit can be used, according to some embodiments. In FIGS. 11A through 11C, shaded coolant distribution manifolds 201 and 202 are in the foreground. Server chassis 105 is shown in dashed lines. When the server chassis 105 is slid into place in the server rack 200, from the front of the server rack, fluid connectors 320 on the blind mating adapter units mate with corresponding mating fluid connectors (not shown) of coolant distribution manifolds 201/2.

With reference to FIG. 11A, two blind mating adapter units are shown coupled to horizontal members 304 using mounting bars 320. Blind mating adapter units are adjustably coupled to a frame that is attached to the server chassis 105 and are slid into position with relation to coolant distribution manifolds 201 and 202. Adapting plate 315 is rotated as may be needed to align fluid connectors 320 on adapting plate 315 to corresponding mating fluid connectors (not shown) on coolant distribution manifolds 201 and 202 (collectively, 201/2). Once the adapting plate 315 fluid connectors 320 have been aligned to the mating plurality of fluid connectors (not shown) on the coolant distribution manifold 201/2, the server can be installed, removed, and reinstalled into the server rack by blind mating, without further adjustment. For clarity, coolant distribution manifolds 201 and 202 are not shown for the blind mating adapter unit on the right hand side of FIG. 11A.

In FIG. 11B, two servers chassis 105 are shown populated through a vertical design, side-by-side in a server rack 200. Similar to FIG. 11A, coolant distribution manifolds 201 and 202 are shown shaded, in the foreground of FIG. 11B, and coolant distribution manifolds 201 and 202 are omitted from the server chassis 105 on the right hand side of FIG. 11B for clarity. In this embodiment, the same blind mating adapter units, as well as cooling module, can be used as the ones shown in FIG. 11A.

In FIG. 11C, two servers chassis 105 are shown populated through a vertical manner, side-by-side in a server rack 200. Similar to FIG. 11A, coolant distribution manifolds 201 and 202 are shown shaded, in the foreground of FIG. 11C, and coolant distribution manifolds 201 and 202 are omitted for the lower two blind mating adapters for clarity.

In the foregoing specification, embodiments of the invention have been described with reference to specific exemplary embodiments thereof. Different selection of connector types, hose, tubing, piping, and structural frame members, and orientations of assemblies can be implemented by one of skill in the art in possession of this disclosure. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A blind mating adapter unit configured to fluidly couple a server in an electronic rack to a coolant distribution manifold via blind mating, the blind mating adapter unit comprising:

an adapting plate having a plurality of fluid connectors on a first side of the adapting plate and a plurality of fluid connection points on a second side of the adapting plate, each fluid connector on the first side corresponding to one of the fluid connection points on the second side, wherein the adapting plate is separable into a first half and a second half;

a mounting bar, adjustably coupled to the adapting plate, wherein the mounting bar is adjustably coupled to a chassis of the server, wherein the first half is slidably coupled to a frame using the mounting bar, and the second half is slidably coupled to the frame using a second mounting bar;

wherein the blind mating adapter unit is configurable to fix an alignment of the plurality of fluid connectors on the first side of the adapting plate to a plurality of mating fluid connectors on a coolant distribution manifold in the electronic rack, such that when the server is installed into the electronic rack, the blind mating adapter unit is blind mated to the mating plurality of fluid connectors on the coolant distribution manifold.

2. The blind mating adapter unit of claim 1, wherein the adapting plate is rotatably coupled to the mounting bar, wherein the adapting plate is configured to be rotatable within ±90° or ±180°.

3. The blind mating adapter unit of claim 2, wherein the blind mating adapter unit is adjustably coupled to the frame that is adjustably coupled to the server chassis.

4. The blind mating adapter unit of claim 3, wherein a location of the blind mating adapter unit on the server chassis is adjustable, using the frame, in a lateral direction (x-axis) and a vertical direction (y-axis) with respect to a direction facing into the electronic rack from the front or back of the electronic rack.

5. The blind mating adapter unit of claim 3, wherein one or more of the plurality of fluid connectors are mounted to the first half, and the remaining of the plurality of fluid connectors are mounted to the second half of the adapting plate.

6. The blind mating adapter unit of claim 5, wherein two horizontal members of the frame are adjustable in length, and the two horizontal members of the frame form a parallelogram that forms a slope from one side of the server chassis to an opposing side of the server chassis, and the first and second half of the blind mating adapter are slidably coupled to the frame.

7. The blind mating adapter unit of claim 1, wherein the fluid connectors on the blind mating adapter unit are dripless quick-connectors.

8. The blind mating adapter unit of claim 1, wherein each of the plurality of fluid connection points on the second side of the adapting plate is configured to receive a manual fluid connection to at least one coolant line of a cooling module within the server.

9. The blind mating adapter unit of claim 1, wherein each of the plurality of fluid connection points on the second side of the adapting plate is configured to be coupled to two coolant lines via a 2-into-1 connection point.

10. A server comprising:
a cooling module comprising a coolant supply line, a heat transfer unit, and a coolant return line;
a blind mating adapter unit adjustably coupled to a chassis of the server, and the blind mating adapter unit includes:
an adapting plate having a plurality of fluid connectors on a first side of the adapting plate and plurality of fluid connection points on a second side of the adapting plate, each fluid connector on the first side corresponding to one of the fluid connection points on the second side, wherein the adapting plate is separable into a first half and a second half, and wherein the first half is slidably coupled to a frame using a mounting bar, and the second half is slidably coupled to the frame with using a second mounting bar;

wherein the adapting plate is configurable to fix an alignment of the plurality of fluid connectors on the first side of the adapting plate to a corresponding mating plurality of fluid connectors on a coolant distribution manifold in an electronic rack, such that when the server is installed in the electronic rack, the plurality of fluid connectors on the blind mating adapter unit is configured to blind mate to the mating plurality of fluid connectors on the coolant distribution manifold.

11. The server of claim 10, wherein the blind mating adapter unit further includes the mounting bar that is configured to be adjustably coupled to the adapting plate and adjustably coupled to the chassis of the server.

12. The server of claim 10, wherein the plurality of fluid connection points on the second side of the adapting plate are configured to be manually fluidly coupled to coolant supply and coolant return lines of the cooling module in the server.

13. The server of claim 11, wherein the adapting plate is rotatably coupled to the mounting bar, wherein the adapting plate is configured to be rotatable within ±90° or ±180°.

14. The server of claim 13, wherein the blind mating adapter unit is adjustably coupled to the frame that is adjustably coupled to the server chassis.

15. The server of claim 14, wherein a location of the blind mating adapter unit on the server chassis is adjustable, using the frame, in a lateral direction (x-axis) and a vertical direction (y-axis).

16. The server of claim 14, wherein
one or more of the plurality of fluid connectors are mounted to the first half and the remainder of the plurality of fluid connecters are mounted to the second half of the blind mating adapter unit.

17. The server of claim 16, wherein two horizontal members of the frame are adjustable in length, and the two horizontal members of the frame form a parallelogram that forms a slope from one side of the server chassis to an opposing side of the server chassis, and the first and second half of the adapting plate are slidably coupled to the frame.

18. The server of claim 10, wherein the plurality of fluid connectors on the blind mating adapter unit are dripless quick-connectors.

19. The server of claim 10, wherein each of the plurality of fluid connection points on the second side of the adapting plate is configured to be coupled to two coolant lines via a 2-into-1 connection point.

20. An electronic rack, comprising:
a plurality of server chassis arranged in a stack, each server chassis including one or more servers, wherein each server chassis comprises:
a cooling module comprising a coolant supply line, a heat transfer unit, and a coolant return line;
a blind mating adapter unit adjustably coupled to a chassis of the server, and the blind mating adapter unit includes:
an adapting plate having a plurality of fluid connectors on a first side of the adapting plate and plurality of fluid connection points on a second side of the adapting plate, each fluid connector on the first side corresponding to one of the fluid connection points on the second side, wherein the adapting plate is separable into a first half and a second half, and wherein the first half is slidably coupled to a frame using a mounting bar, and the second half is slidably coupled to the frame with using a second mounting bar;

wherein the adapting plate is configurable to fix an alignment of the plurality of fluid connectors on the first side of the adapting plate to a corresponding mating plurality of fluid connectors on a coolant distribution manifold in an electronic rack, such that when the server is installed in the electronic rack, the plurality of fluid connectors on the blind mating adapter unit is configured to blind mate to the mating plurality of fluid connectors on the coolant distribution manifold.

\* \* \* \* \*